(12) United States Patent
Grandemange

(10) Patent No.: US 9,280,208 B2
(45) Date of Patent: Mar. 8, 2016

(54) PROCESS FOR DETERMINING THE ACTIVATION OF AT LEAST ONE KEY OF A MULTI-KEY DEVICE

(71) Applicant: DELPHI TECHNOLOGIES, INC., Troy, MI (US)

(72) Inventor: Eric Grandemange, Strasbourg (FR)

(73) Assignee: Delphi Technologies, Inc., Troy, MI (US)

( * ) Notice: Subject to any disclaimer, the term of this patent is extended or adjusted under 35 U.S.C. 154(b) by 63 days.

(21) Appl. No.: 14/358,370

(22) PCT Filed: Mar. 18, 2013

(86) PCT No.: PCT/EP2013/055550
§ 371 (c)(1),
(2) Date: May 15, 2014

(87) PCT Pub. No.: WO2013/135906
PCT Pub. Date: Sep. 19, 2013

(65) Prior Publication Data
US 2014/0300552 A1 Oct. 9, 2014

(30) Foreign Application Priority Data

Mar. 16, 2012 (FR) ...................................... 12 00809

(51) Int. Cl.
*G06F 3/023* (2006.01)
*G06F 3/02* (2006.01)
*H03K 17/96* (2006.01)

(52) U.S. Cl.
CPC .............. *G06F 3/023* (2013.01); *G06F 3/0202* (2013.01); *H03K 17/9625* (2013.01)

(58) Field of Classification Search
CPC .... G06F 3/023; G06F 3/0202; H03K 17/9625
See application file for complete search history.

(56) References Cited

U.S. PATENT DOCUMENTS

| 5,440,237 A | 8/1995 | Brown et al. |
| 2009/0066673 A1 | 3/2009 | Molne et al. |
| 2011/0084912 A1* | 4/2011 | Almalki ................. G06F 3/041 345/173 |

FOREIGN PATENT DOCUMENTS

WO    2012/004370 A1    1/2012

*Primary Examiner* — Liliana Cerullo
(74) *Attorney, Agent, or Firm* — Lawrence D. Hazelton

(57) ABSTRACT

The invention relates to a process for determining the activation of at least one key of a multi-key device. The multi-key device comprises a plurality of keys $K_1$ to $K_n$ and a plurality of force sensors $C_1$ to $C_n$, each force sensor $C_1$ to $C_n$ being associated respectively with a key $K_1$ to $K_n$ and able to provide a value representing a force which is applied to it. The process is characterized by the fact that it comprises the steps: obtaining values $F'_1$ to $F'_n$ representing the force applied to each of the force sensors $C_1$ to $C_n$; providing transmission rate values of a pressing force between the keys; removing the contribution of each of the force values $F'_1$ to $F'_n$ from the pressing force transmitted between the keys using the transmission rate values provided; and determining values $F_1$ to $F_n$ representing the pressing force which has been applied by the user to the keys $K_1$ to $K_n$.

6 Claims, 3 Drawing Sheets

PROCESS FOR DETERMINING THE ACTIVATION OF AT LEAST ONE KEY OF A MULTI-KEY DEVICE

CROSS-REFERENCE TO RELATED APPLICATION

This application claims the benefit under 35 U.S.C. §371 of published PCT Patent Application Number PCT/EP 2013/055550, filed Mar. 18, 2013, claiming priority to French patent application number FR12/00809 filed on 16 Mar. 2012, and published as WO2013/135906 on Sep. 19, 2013, the entire contents of which is hereby incorporated by reference herein.

TECHNICAL FIELD OF INVENTION

The present invention relates generally to a process or algorithm for determining the key or keys of a multi-keyed device on which a user has pressed. The invention is applied to multi-key devices and more particularly to multi-key devices or apparatus that includes force sensors having a resistance sensitive to an applied force (FSR, Force Sensitive Resistor) and operating in a pre-loaded condition, and in which the activation of a key is determined when a sensed force is greater than a predetermined force threshold.

BACKGROUND OF INVENTION

Multi-key devices exist that include a plurality of keys which are activated by FSR force sensors the resistance of which varies as a function of the force applied to the key and the sensor. The device includes an algorithm permitting determination that a key has been pressed and activated when the amplitude of the applied force is greater than a predetermined force threshold.

One algorithm currently used is based on a high-pass filter having a long time constant (16 samples for a sampling period of 20 msec). The output value of this filter, which depends on the velocity and on the actuation force, is compared with thresholds to detect any change of the sensor.

Another currently used algorithm is based on a software task (long period) responsible for calculating an inactive state for the keys. On the basis of the level of the evaluated inactive state, a second software task (quick period) compares a current pressure level with the level of the recalculated inactive state.

However, it happens that the currently used algorithms do not permit correct identification of the keys pressed when a user presses on a plurality of different keys of a multi-key device in a connected manner. When a user presses on several different keys, a pressure can be applied to the force sensors of other keys on which the user has not directly pressed (particularly when the space between the keys is small), and these force sensors then provide signals to the device indicating that their keys have been pressed while in reality the user has only pressed on adjacent keys.

In addition, when a user presses heavily and/or for a long time on a key, the force sensors of the adjacent keys can receive a large pressure and provide a signal to the device indicating that their keys have been pressed.

Thus, the device does not correctly determine the keys which have really been touched and pressed by the user and, therefore, does not correctly determine the keys which the user wished to activate.

SUMMARY OF THE INVENTION

An aim of the present invention is to respond to the disadvantages mentioned above by providing a process for determining the key or keys of a multi-key device on which a user has really pressed.

To this end, a first aspect of the present invention relates to a process for determining the activation of at least one key of a multi-key device, the multi-key device includes a plurality of keys $K_1$ to $K_n$ and a plurality of force sensors $C_1$ to $C_n$, each force sensor $C_1$ to $C_n$ being respectively associated with a key $K_1$ to $K_n$ and able to provide a value representing a force which is applied to it, the process being characterised by the fact that it includes the steps of: obtaining values $F'_1$ to $F'_n$ representing the force applied to each of the force sensors $C_1$ to $C_n$; providing transmission rate values of a pressing force between the keys (K); removing the contribution of each of the force values $F'_1$ to $F'_n$ from the pressing force (F) transmitted between the keys (K) using the transmission rate values ($T_{ij}$) provided; and determining values $F_1$ to $F_n$ representing the pressing force which has been applied by the user to the keys $K_1$ to $K_n$.

Such a process permits elimination of the parasitic forces applied to the sensors which emanate from the adjacent keys and permits determination of the keys which have really been pressed by the user.

In accordance with an advantageous embodiment, at the step of providing transmission rate values, the transmission rate values $T_{ij}$ are provided for each key $K_1$ to $K_n$, each transmission rate value $T_{ij}$ representing the part of a pressing force transmitted from a first key $K_j$ to a second key $K_i$ when the user presses on the first key $K_j$, the transmission rate values $T_{ij}$ being provided for j=1 to n and i=1 to n. The process thus permits elimination of the parasitic forces applied to a sensor which emanate from all the other keys and permits very precise determination of the keys which have really been pressed by the user.

In accordance with an advantageous embodiment, the transmission rate values $T_{ij}$ are included in a transmission rate matrix T having the following form:

$$\begin{pmatrix} T_{11} & \cdots & T_{1n} \\ \vdots & \ddots & \vdots \\ T_{n1} & \cdots & T_{nn} \end{pmatrix}$$

and the values $F_1$ to $F_n$ representing a pressing force applied by the user to the keys of the multi-key device (1) are determined using the following formula in which the inverse of the transmission rate matrix $T^{-1}$ is multiplied by a vector of the values $F'_1$ to $F'_n$ representing the force applied to the force sensors $C_1$ to $C_n$:

$$\begin{pmatrix} F_1 \\ \vdots \\ F_n \end{pmatrix} = \begin{pmatrix} T_{11} & \cdots & T_{1n} \\ \vdots & \ddots & \vdots \\ T_{n1} & \cdots & T_{nn} \end{pmatrix}^{-1} \cdot \begin{pmatrix} F'_1 \\ \vdots \\ F'_n \end{pmatrix}$$

The use of a matrix allows the calculations to be made more rapidly.

Advantageously, the transmission rate values $T_{ij}$ provided depend in particular on the distance between the keys. It is thus possible to provide transmission rate values $T_{ij}$ for adjacent keys and for keys remote one from the other, to allocate a value of zero to the transmission rate values $T_{ij}$ in order to make the calculations of the multi-key device less intensive.

In very advantageous manner, the transmission rate values $T_{ij}$ are fixed at zero for keys which are separated by a distance greater than a predetermined distance. It is thus possible to make the calculations of the multi-key device less intensive.

In accordance with an advantageous embodiment, the transmission rate values $T_{ij}$ are fixed at zero for keys which are separated by at least one intercalary key, or at least two intercalary keys. It is thus possible to make the calculations of the multi-key device less intensive.

In accordance with an advantageous embodiment, the transmission rate values $T_{ij}$ are measured values or values theoretically calculated by digital simulation. This allows very precise calculation of the values $F_1$ to $F_n$.

In accordance with another advantageous embodiment, the force sensor is an FSR sensor having a resistance sensitive to an applied force.

In accordance with another advantageous embodiment, the multi-key device includes a support that includes a first and a second surface and pressing surfaces of the keys are situated on the first surface and a force is applied to the plurality of force sensors via the second surface.

In accordance with a second aspect, the present invention relates to a computer program product for a processing unit stored on a support and includes portions of software code readable by the processing unit to execute the steps of the process such as defined above.

BRIEF DESCRIPTION OF DRAWINGS

Other characteristics and advantages of the present invention will become more clearly apparent on reading the following detailed description of embodiments of the invention given as in no way limiting examples and illustrated by the attached drawings, in which.

DETAILED DESCRIPTION

Figure 1:
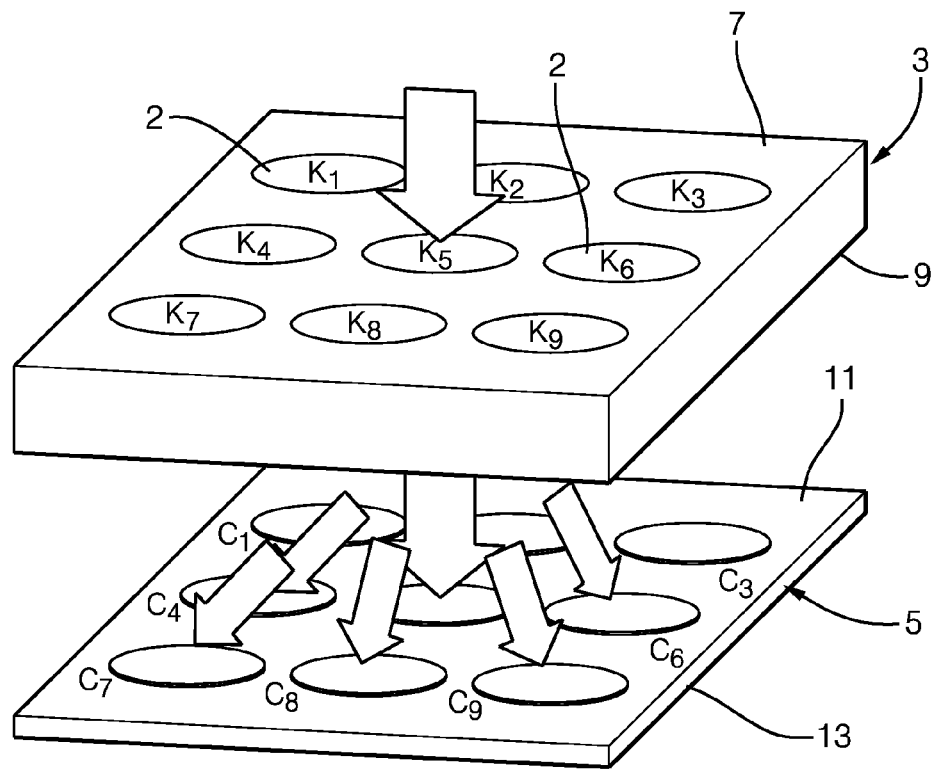
FIG. 1 shows a multi-key device having nine keys in which an embodiment of the invention is presented.
Figure 2A:
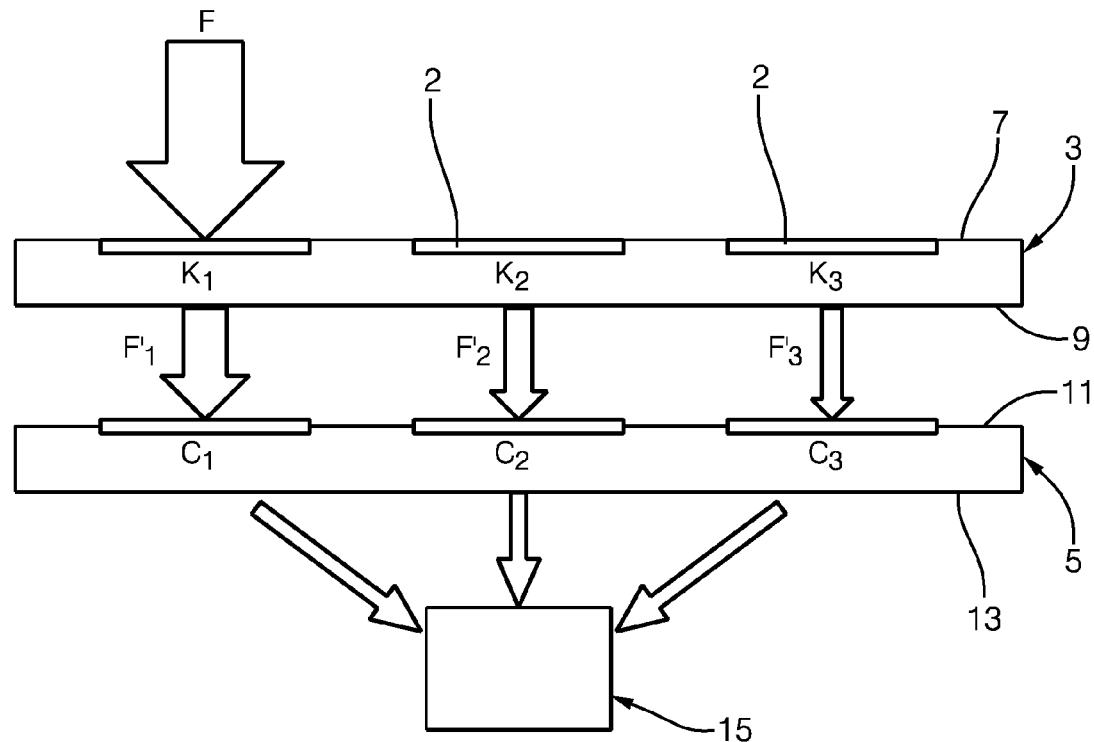
FIG. 2 shows a multi-key device having three keys in which an embodiment of the invention is presented.

The invention will be described below solely by means of non-limiting examples in relation to the Figures. FIGS. 1, 2(a), (b) and (c) show a multi-key device in which an embodiment of the invention is presented.

FIG. 1 shows a multi-key device 1 that includes a plurality of keys K each including a pressing surface 2 on which a user places his finger to press and actuate the key.

The multi-key device 1 that includes the keys $K_1$ to $K_n$ where n=9 and a plurality of force sensors $C_1$ to $C_n$ where n=9. Each of the keys $K_1$ to $K_9$ is associated with a force sensor of the plurality of force sensors $C_1$ to $C_9$ and when a user presses on a key K, it is the force sensors C associated with this key K which mainly receives the pressing force of the user and provides a signal indicating that its associated key K has been pressed.

In the multi-key device 1 shown in FIG. 1, the keys $K_1$ to $K_9$ are respectively associated with the force sensors $C_1$ to $C_9$, i.e. the key $K_1$ is associated with the force sensor $C_1$, the key $K_2$ is associated with the force sensor $C_2$ etc.

The multi-key device 1 includes a first support 3 and a second support 5. The first support 3 includes a first surface 7 and a second surface 9, and the second support 5 includes a first surface 11 and a second surface 13. The pressing surfaces 2 are situated on the first surface 7 which is an external surface visible to the user and the force sensors $C_1$ to $C_9$ are situated inside the device 1 on the first surface 11 of the second support 5 and facing the second surface 9 of the first support 3.

The first support 3 and the second support 5 are shown separated in the Figures to facilitate understanding of the present invention, but in reality the second surface 9 of the first support 3 is in contact directly, or indirectly via a flexible substrate, with the plurality of force sensors $C_1$ to $C_9$. Optionally, another flexible substrate can be present between the plurality of force sensors $C_1$ to $C_9$ and the first surface 11 of the second support 5. In addition, the first support 3 can be connected to the second support 5 in such a manner as to apply a predetermined force to the plurality of force sensors $C_1$ to $C_9$ and the device 1 is thus in a pre-loaded state.

Each force sensor C includes an FSR layer having a resistance sensitive to an applied force (Force Sensitive Resistor) and a first and a second electrically conductive track (not shown) in direct contact with the layer. When a force is applied to a sensor, for example by a user pressing on the associated key, a short-circuit is formed between the first and the second track and in addition the resistance of the layer changes (for example, it decreases) so that the electrical resistance between the first and the second track also changes (for example, it decreases).

Alternatively, other force sensors such as those using a variation in electrical capacitance or the intensity of an electromagnetic wave can be used.

A signal representing the value of the electrical resistance between the first and the second track is received by a microcontroller 15 (FIG. 2) of the device 1 which is connected to each force sensor $C_1$ to $C_9$. The microcontroller 15 is configured to process this received signal in order to determine whether the user has pressed on a key K. The device 1 includes a memory (not shown) containing at least one program/algorithm which is used by the microcontroller 15 to process the received signal in order to determine whether a key K has been pressed.

As shown in FIG. 2(a), when the user applies a pressing force F to a key K, for example the key $K_1$, a force $F'_1$ is applied to the force sensor $C_1$. The force $F'_1$ applied to the force sensor $C_1$ modifies the resistance value and the signal delivered to the microcontroller 15, and the microcontroller 15 determines, on the basis of the change in this value, that the key $K_1$ has been pressed by the user.

FIGS. 2(a), (b) and (c), show a multi-key device identical to the device shown in FIG. 1 but which includes only three keys $K_1$, $K_2$ and $K_3$ in order to facilitate understanding of the present invention.

When the user applies a pressing force F to the key $K_1$, a force $F'_1$ is not only applied to the force sensor $C_1$ but a force $F'_2$ and a force $F'_3$ are simultaneously applied to the force sensors $C_2$ and $C_3$ respectively since the first support 3 is displaced towards the second support 5 when the user presses. A part of the force F applied to the key $K_1$ is transmitted to the adjacent keys so that a force is applied to the force sensors $C_2$ and $C_3$ via the second surface 9 of the first support 3. This also happens when the user applies a pressing force F to the key $K_2$ and a pressing force F to the key $K_3$, as shown in FIGS. 2(b) and 2(c).

As mentioned above, when the user presses heavily and/or for a long time on the key $K_1$, the microcontroller 15 receives resistance values from each of the force sensors $C_1$ to $C_3$ indicating a change of resistance value and it could determine incorrectly that the user has pressed on the keys $K_1$ and $K_2$, or each of the three keys $K_1$, $K_2$ and $K_3$.

In addition, when the user presses on the keys $K_1$ and $K_3$, the microcontroller 15 receives a resistance value of the force sensor $C_2$, indicating a change in resistance value, and it could determine incorrectly, for example, that the user has pressed on each of the three keys $K_1$, $K_2$ and $K_3$.

The microcontroller 15 of the device 1 is configured to use a process (or an algorithm) in accordance with the present invention to determine whether one or more keys have been activated. The process permits determination of the key on which the user has really pressed, or the keys on which the user has really pressed.

Figure 3:
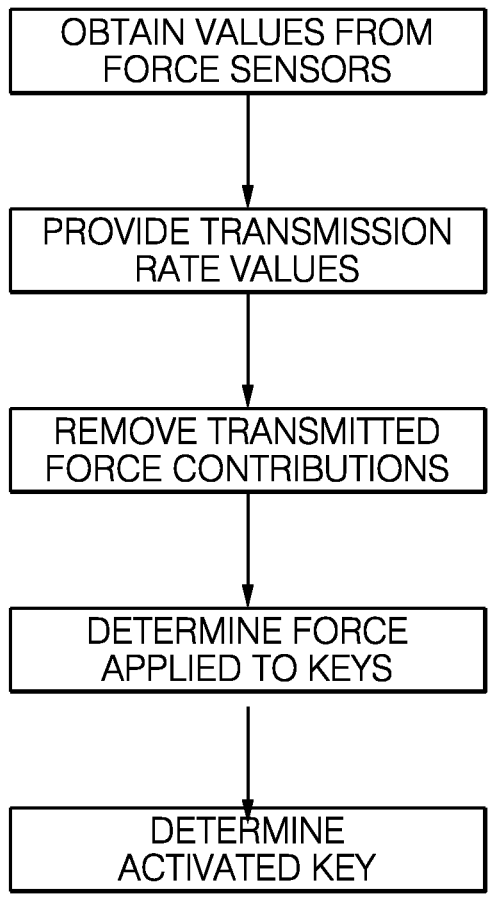
FIG. 3 shows steps of the process in accordance with an embodiment of the present invention.

This process in accordance with the present invention includes a step S1 of obtaining (FIG. 3), from each of the force sensors $C_1$ to $C_3$, values $F'_1$ to $F'_3$ representing the force applied to the force sensors $C_1$ to $C_3$.

The process includes in addition a step S2 of providing transmission rate values $T_{ij}$ of a pressing force between keys. The step includes providing transmission rate values $T_{ij}$ for each key $K_1$, $K_2$ and $K_3$ in which each transmission rate value $T_{ij}$ represents the part of a force transmitted, mechanically or involuntarily, from a first key $K_j$ to a second key $K_i$, when the user presses on the first key $K_j$. For example, in FIG. 2(*a*), the transmission rate value $T_{21}$ represents the part of the force F transmitted from the key $K_1$ to the key $K_2$ and which produces the force $F'_2$ applied to the force sensor $C_2$; and the transmission rate value $T_{31}$ represents the part of the force F transmitted from the key $K_1$ to the key $K_3$ and which produces the force $F'_3$ applied to the force sensor $C_3$.

Figure 2:
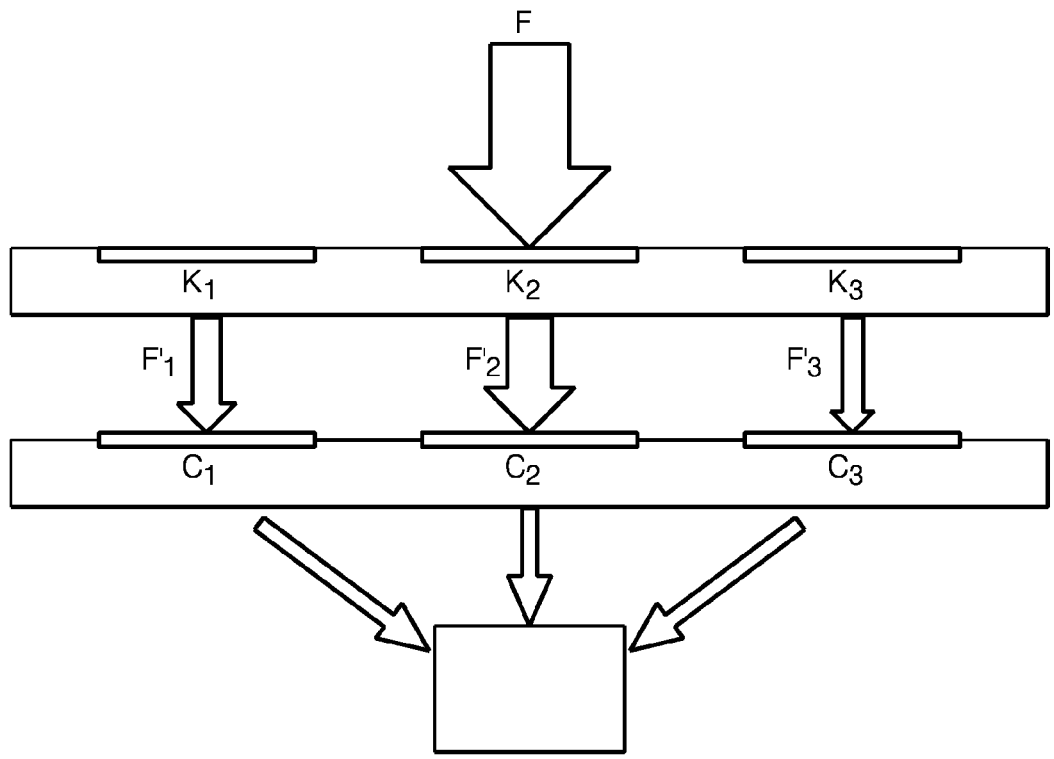
Figure 2:
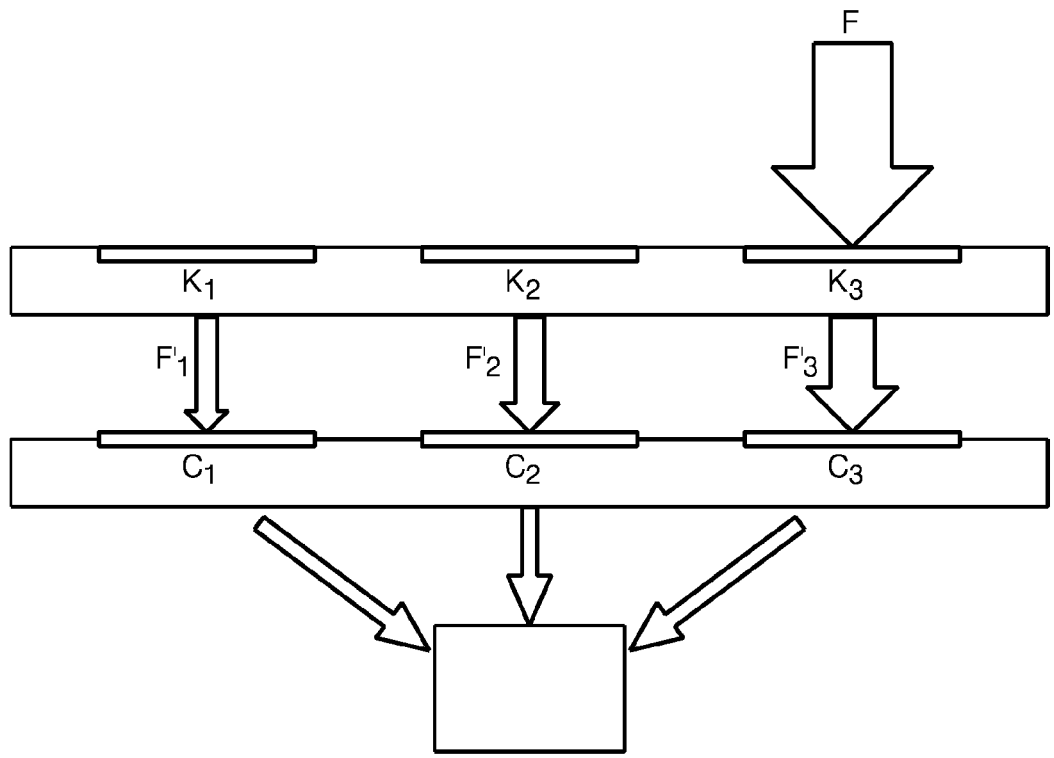

In this step S2, the transmission rate values $T_{ij}$ are provided for j=1 to 3 and i=1 to 3; i.e. the transmission rate values $T_{11}$, $T_{21}$, $T_{31}$ (corresponding to the situation shown in FIG. 2(*a*)), $T_{12}$, $T_{22}$, $T_{23}$ (corresponding to the situation shown in FIG. 2(*b*)) and $T_{31}$, $T_{32}$, $T_{33}$ corresponding to the situation shown in FIG. 2(*c*)) are provided.

In a modified embodiment of the present invention, the transmission rate values $T_{ij}$ for keys remote from one another (by a distance greater than a predetermined distance or by at least one, at least two or more intercalary keys) are allocated a value of zero (0) in order to make the calculations of the device 1 less intensive. For example, for the device 1 shown in FIGS. 2(*a*), (*b*) and (*c*), $T_{31}$=0 and $T_{13}$=0.

The process includes in addition a step S3 of removing the contribution of each of the force values $F'_1$ to $F'_n$ emanating from the pressing force F transmitted between the keys K, using the transmission rate values $T_{ij}$ provided. The contribution to the values of the forces $F'_1$, $F'_2$ and $F'_3$ emanating from the pressing force transmitted by the keys $K_1$ to $K_3$ is removed, using the transmission rate values $T_{ij}$.

The process includes in addition a step S4 of determining values $F_1$ to $F_3$ representing the pressing force which has really been applied by the user to the keys $K_1$ to $K_3$ and indicating the keys $K_1$ to $K_3$ which the user has physically touched or pressed.

The process includes in addition a step S5 of determining the key or the keys activated on the basis of the values $F_1$ to $F_3$ determined.

The process can optionally include in addition a step S6 of providing the values $F_1$ to $F_3$ representing the pressing force which has really been applied by the user to the keys $K_1$ to $K_3$ to another algorithm stored in the device 1 in order to use this result to implement an application or perform an action.

For example, in accordance with the present invention, for the situation shown in FIG. 2(*a*), the contribution to each of the forces $F'_2$ and $F'_3$ emanating from the force transmitted, following the application of the force F to the key $K_1$, is removed so that only the value $F_1$ of the values $F_1$ to $F_3$ representing the pressing force which has really been applied by the user to the keys $K_1$ to $K_3$ will have a high value indicating that only the key $K_1$ has been pressed by the user.

The transmission rate values $T_{ij}$ are measured values (for example, by measuring the forces applied to the sensors when each of the keys is pressed) or are values theoretically calculated by digital simulation. The transmission rate values $T_{ij}$ are included in a transmission rate matrix T having the following form (in which n is the number of keys of the device 1):

$$\begin{pmatrix} T_{11} & \cdots & T_{1n} \\ \vdots & \ddots & \vdots \\ T_{n1} & \cdots & T_{nn} \end{pmatrix}$$

A vector of the values $F'_1$ to $F'_n$ representing the forces applied to the force sensors $C_1$ to $C_n$ when a force F is applied to the keys of the device 1 is given by the following formula in which the transmission rate matrix T is multiplied by a vector of the values $F_1$ to $F_n$ representing the forces applied to the keys of the device 1:

$$\begin{pmatrix} F'_1 \\ \vdots \\ F'_n \end{pmatrix} = \begin{pmatrix} T_{11} & \cdots & T_{1n} \\ \vdots & \ddots & \vdots \\ T_{n1} & \cdots & T_{nn} \end{pmatrix} \cdot \begin{pmatrix} F_1 \\ \vdots \\ F_n \end{pmatrix}$$

The values $F_1$ to $F_n$ representing the pressing force which the user has really applied to the key $K_1$ to $K_n$ and indicating the keys $K_1$ to $K_3$ which the user has physically touched or pressed are determined using the following formula in which the inverse of the transmission rate matrix $T^{-1}$ is multiplied by the vector of the values $F'_1$ to $F'_n$ representing the forces applied to the force sensors $C_1$ to $C_n$:

$$\begin{pmatrix} F_1 \\ \vdots \\ F_n \end{pmatrix} = \begin{pmatrix} T_{11} & \cdots & T_{1n} \\ \vdots & \ddots & \vdots \\ T_{n1} & \cdots & T_{nn} \end{pmatrix}^{-1} \cdot \begin{pmatrix} F'_1 \\ \vdots \\ F'_n \end{pmatrix}$$

For example, for the device 1 having three keys 2 such as shown in FIGS. 2(*a*), 2(*b*) and 2(*c*), if 50% of the force F is transmitted to the sensor $C_1$, 20% to the sensor $C_2$ and 5% to the sensor $C_3$ when the user presses on the key $K_1$ with a force F; and 25% of the force F is transmitted to the sensor $C_1$, 50% to the sensor $C_2$ and 25% to the sensor $C_3$ when the user presses on the key $K_2$ with a force F; and if 5% of the force F is transmitted to the sensor $C_1$, 30% to the sensor $C_2$ and 50% to the sensor $C_3$ when the user presses on the key $K_3$ with a force F, the resulting 3×3 transmission rate matrix T is as follows:

$$\begin{matrix} 0.5 & 0.25 & 0.05 \\ 0.2 & 0.50 & 0.3 \\ 0.05 & 0.25 & 0.5 \end{matrix}$$

and the inverse of the 3×3 transmission rate matrix $T^{-1}$ is:

$$\begin{matrix} 2.59 & -1.67 & 0.74 \\ -1.26 & 3.67 & -2.07 \\ 0.37 & -1.67 & 2.96 \end{matrix}$$

When the user presses on the key $K_1$ and then on the key $K_3$ (situation of FIGS. 2(*a*) and 2(*c*)), a force is applied to each of the three sensors $C_1$ to $C_3$ and a state of the art microcontroller 15 could incorrectly determine that the user has pressed on each of the three keys $K_1$, $K_2$ and $K_3$. The present invention allows such an error to be avoided and the provision of the values $F_1$ to $F_n$ indicating the keys $K_1$ to $K_3$ which the user has really pressed.

If the measured values $F'_1$ to $F'_3$ representing the forces applied to the force sensors $C_1$ to $C_3$ are, for example, $F'_1=1.2N$, $F'_2=1.6N$ and $F'_3=2.1N$, the vector of the values $F'_1$ to $F'_3$ representing the forces applied to the force sensors $C_1$ to $C_n$ is $F'=\{1.2N; 1.6N; 2.1N\}$. The values $F_1$ to $F_3$ representing the pressing force which the user has applied to the keys $K_1$ to $K_3$ are determined as indicated below, by applying the formula:

$$\begin{pmatrix} F_1 \\ \vdots \\ F_n \end{pmatrix} = \begin{pmatrix} T_{11} & \cdots & T_{1n} \\ \vdots & \ddots & \vdots \\ T_{n1} & \cdots & T_{nn} \end{pmatrix}^{-1} \cdot \begin{pmatrix} F'_1 \\ \vdots \\ F'_n \end{pmatrix}$$

where, the force $F_1$ on the key $K_1$ is $2.59*1.2N-1.67*1.6N+0.77*2.1N=2N$; the force $F_2$ on the key $K_2$ is: $-1.26*1.2N+3.67*1.6N-2.07*2.1N=0N$; and the force $F_3$ on the key $K_3$ is: $0.37*1.2N-1.67*1.6N+2.96*2.1N=4N$.

The state of the art microcontroller 15 would have interpreted that the values $F'_1=1.2N$, $F'_2=1.6N$ and $F'_3=2.1N$ indicate that the key $K_3$ has alone been pressed (since the value $F'_3$ is the maximum value) or that the keys $K_2$ and $K_3$ or $K_1$, $K_2$ and $K_3$ have been pressed. Conversely, by means of the process of the present invention, the microcontroller 15 will determine that the key $K_1$ and the key $K_3$ have been pressed/activated and that the key $K_2$ has not been pressed/activated. The process in accordance with the present invention thus permits correct identification of all the keys pressed/activated when a user presses on multiple keys 2.

In addition, when the user has pressed heavily and/or for a long time on a key, for example $K_1$, the process in accordance with the present invention also permits determination of the values $F_1$ to $F_3$ as indicated above and correct identification that the key $K_1$ has been pressed.

The present invention also relates to a computer program for a processing unit, such as the microcontroller 15, stored on a support and includes portions of software code readable by the processing unit to execute the steps of the process.

It will be understood that various modifications and/or improvements obvious to the man skilled in the art can be made to the different embodiments of the invention described in the present description without departing from the scope of the invention defined by the attached claims.

The invention claimed is:

1. A process for determining the activation of at least one key of a multi-key device, the multi-key device comprising a plurality of keys $K_1$ to $K_n$, where n is an integer number of keys, and a plurality of force sensors $C_1$ to $C_n$, each force sensor $C_1$ to $C_n$ being associated respectively with one of the plurality of keys $K_1$ to $K_n$, the process comprising the steps of:

obtaining values $F'_1$ to $F'_n$, each of the values representing a force applied to each of the force sensors $C_1$ to $C_n$, respectively;

providing transmission rate values ($T_{ij}$) that are measured values or values calculated theoretically by digital simulation indicative of a pressing force transmitted between each of the plurality of keys, where i and j are integers indicative of a portion of the pressing force transmitted from a first key Kj to a second key Ki when the first key Kj is pressed for j=1 to n and i=1 to n;

removing the contribution of each of the force values $F'_1$ to $F'_n$ emanating from the pressing force transmitted between each of the plurality of keys by using the transmission rate values ($T_{ij}$) provided; and determining values $F_1$ to $F_n$ representing the pressing force which has been applied by a user to the plurality of keys $K_1$ to $K_n$, wherein the transmission rate values $T_{ij}$ are included in a transmission rate matrix (T) having the form:

$$\begin{pmatrix} T_{11} & \cdots & T_{1n} \\ \vdots & \ddots & \vdots \\ T_{n1} & \cdots & T_{nn} \end{pmatrix}$$

and the values $F_1$ to $F_n$ representing the pressing force applied by the user to each of the keys of the multi-key device are determined using the following formula in which the inverse of the transmission rate matrix ($T^{-1}$) is multiplied by a vector of the values $F'_1$ to $F'_n$ representing the force applied to the force sensors $C_1$ to $C_n$;

$$\begin{pmatrix} F_1 \\ \vdots \\ F_n \end{pmatrix} = \begin{pmatrix} T_{11} & \cdots & T_{1n} \\ \vdots & \ddots & \vdots \\ T_{n1} & \cdots & T_{nn} \end{pmatrix}^{-1} \cdot \begin{pmatrix} F'_1 \\ \vdots \\ F'_n \end{pmatrix},$$

wherein the transmission rate values $T_{ij}$ are fixed at zero for keys which are separated by a distance greater than a predetermined distance.

2. The process as described in claim 1, wherein the transmission rate values $T_{ij}$ provided depend on the distance between the each of keys.

3. The process as described in claim 1, wherein the transmission rate values $T_{ij}$ are fixed at zero for keys which are separated by at least one intervening key.

4. The process as described in claim 1, wherein each force sensor is a sensor having a resistance sensitive to an applied force (FSR).

5. The process as described in claim 1, wherein the multi-key device includes a support comprising a first surface and a second surface, and pressing surfaces of the plurality of keys are situated on the first surface, and a force is applied to the plurality of force sensors via the second surface.

6. A non-transitory computer program product for a processing unit stored on a support and comprising portions of software code readable by the processing unit to execute the steps of the process as described in claim 1.

* * * * *